(12) United States Patent
Ozaki et al.

(10) Patent No.: US 10,666,308 B2
(45) Date of Patent: May 26, 2020

(54) COMMUNICATION-ADAPTER MOUNTING DEVICE

(71) Applicant: Mitsubishi Electric Corporation, Tokyo (JP)

(72) Inventors: Den Ozaki, Tokyo (JP); Kazuhito Kojima, Tokyo (JP); Hiroshi Omura, Tokyo (JP); Shuichi Kuroki, Tokyo (JP); Yohei Koyanagi, Tokyo (JP); Takuya Niimura, Tokyo (JP); Katsuya Ishigami, Tokyo (JP); Tsuyoshi Hayashi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/344,075

(22) PCT Filed: Jan. 20, 2017

(86) PCT No.: PCT/JP2017/001979
§ 371 (c)(1),
(2) Date: Apr. 23, 2019

(87) PCT Pub. No.: WO2018/134978
PCT Pub. Date: Jul. 26, 2018

(65) Prior Publication Data
US 2020/0067556 A1    Feb. 27, 2020

(51) Int. Cl.
*H04B 1/3877*    (2015.01)
*F16B 2/22*    (2006.01)
*H05K 7/14*    (2006.01)

(52) U.S. Cl.
CPC ............ *H04B 1/3877* (2013.01); *F16B 2/22* (2013.01); *H05K 7/14* (2013.01)

(58) Field of Classification Search
CPC ..... A45F 2200/0516; B60R 2011/0059; F16B 2/245; H04B 1/3877
See application file for complete search history.

(56) References Cited

U.S. PATENT DOCUMENTS 5,593,124 A  *  1/1997  Wang .................. B60R 11/0241
                                              248/231.81
8,020,825 B2 *  9/2011  Dostaler ............ A47G 23/0225
                                              24/332

(Continued)

FOREIGN PATENT DOCUMENTS

EP    2 881 677 A1    6/2015
JP    H01-108635 U    7/1989

(Continued)

OTHER PUBLICATIONS

International Search Report of the International Searching Authority dated Apr. 18, 2017 for the corresponding international application No. PCT/JP2017/001979 (and English translation).

*Primary Examiner* — Bradley Duckworth
(74) *Attorney, Agent, or Firm* — Posz Law Group, PLC (57) ABSTRACT

A communication-adapter mounting device is used for mounting a communication adapter that relays communication between an air-conditioning apparatus and another apparatus. The communication-adapter mounting device includes a body into which the communication adapter is to be accommodated and from which the communication adapter is allowed to be removed, and a clip to mount the body to a housing of the air-conditioning apparatus. A mounting plate of the body includes a mounting hole for securing the communication-adapter mounting device to an installation location in which to install the communication adapter. Further, the body has a clip holding mechanism to hold the clip and to allow the clip to be removed.

7 Claims, 9 Drawing Sheets

(56) References Cited

U.S. PATENT DOCUMENTS

| | | | |
|---|---|---|---|
| 8,256,071 B2* | 9/2012 | Okuda | A45F 5/02 24/517 |
| 8,517,236 B2* | 8/2013 | Kushner | A45F 5/00 224/247 |
| 9,816,867 B2* | 11/2017 | Ishikawa | G01K 1/146 |
| 10,104,928 B2* | 10/2018 | Volmer | A42B 1/24 |
| 2014/0338160 A1* | 11/2014 | Chien | F16B 2/245 24/530 |
| 2016/0347257 A1* | 12/2016 | Buchanan | B60R 11/02 |
| 2017/0005686 A1* | 1/2017 | Borisen | H04B 1/3888 |
| 2019/0104830 A1* | 4/2019 | Cortellacci | A45F 5/00 |
| 2019/0289989 A1* | 9/2019 | Bacallao | A45F 5/021 |
| 2019/0309779 A1* | 10/2019 | Bokusky | F16B 17/00 |

FOREIGN PATENT DOCUMENTS

| | | |
|---|---|---|
| JP | 2005-317651 A | 11/2005 |
| WO | 2014/020879 A1 | 2/2014 |

\* cited by examiner

FIG. 15

COMMUNICATION-ADAPTER MOUNTING DEVICE

CROSS REFERENCE TO RELATED APPLICATION

This application is a U.S. national stage application of PCT/JP2017/001979 filed on Jan. 20, 2017, the contents of which are incorporated herein by reference.

TECHNICAL FIELD

The present invention relates to a communication-adapter mounting device for a communication adapter used for an air-conditioning apparatus.

BACKGROUND ART

Recent years have seen increasing demand for introducing systems such as home energy management system (HEMS) and smart grid to office buildings, hotels, homes, and other buildings to perform controls such as remote and centralized control of apparatuses to thereby achieve, for example, energy management, enhanced convenience, and increased energy saving. From the view of energy saving, in Europe as well, there has been a strong demand for the introduction of systems that enable remote control of air-conditioning apparatuses from an outside of homes, and systems that enable centralized control of typical home electronics including air-conditioners.

Wi-Fi (registered trademark, the same applies hereinafter) has evolved as a mode of data communication for such systems. Wi-Fi communication is becoming increasingly common in areas such as office buildings, hotels, and homes, mainly in regions such as Europe and North America. Portable terminals that support Wi-Fi communication are also rapidly becoming commonplace, and the demand for performing control of apparatuses or other such operations by use of portable terminals or other apparatuses is expected to increase. For instance, the adoption of energy management utilizing application programs that run on portable terminals is expected to increase. Further, there have been introduced systems that enable management of the operational status of home electronics and remote control of home electronics through application programs that run on portable terminals.

Communication apparatuses that provide communication between apparatuses by use of Wi-Fi communication have been known (see Patent Literature 1). The communication apparatus described in Patent Literature 1 includes a pivotable cover. Pivotally moving the cover switches states between a visible state in which all the arranged indicator lamps are exposed, and an invisible state in which all the arranged indicator lamps are shaded. With the communication apparatus described in Patent Literature 1, all the indicator lamps are shaded and rendered invisible when there is no need to check the communication state or other operational states. This configuration ensures that lighting and flashing of the indicator lamps do not become visually annoying to the user.

CITATION LIST

Patent Literature

Patent Literature 1: Japanese Unexamined Patent Application Publication No. 2005-316751

SUMMARY OF INVENTION

Technical Problem

The body of the communication apparatus described in Patent Literature 1 has a rectangular bottom surface. A mounting hole is provided at each of the four corners of the rectangular bottom surface. The communication apparatus described in Patent Literature 1 is secured to an erected structure or other such objects with a screw inserted through each of the four mounting holes. This configuration limits where the communication apparatus described in Patent Literature 1 can be mounted, resulting in reduced freedom in installing the communication apparatus.

The present invention has been made to address the above-mentioned problem, and it is an object of the present invention to provide a communication-adapter mounting device that has increased freedom in installing the communication adapter.

Solution to Problem

According to an embodiment of the present invention, there is provided a communication-adapter mounting device for mounting a communication adapter that relays communication between an air-conditioning apparatus and another apparatus, the communication-adapter mounting device including a body into which the communication adapter is to be accommodated and from which the communication adapter is allowed to be removed, and a clip to mount the body to a housing of the air-conditioning apparatus. The body has a mounting hole for securing the communication-adapter mounting device to an installation location in which to install the communication adapter, and the body has a clip holding mechanism to hold the clip and to allow the clip to be removed.

Advantageous Effects of Invention

With the communication-adapter mounting device according to an embodiment of the present invention, the clip is held by the clip holding mechanism provided on the body and is allowed to be removed from the clip holding mechanism. In a state in which the clip is mounted on the body, the communication-adapter mounting device can be mounted to a desired location on the housing of the air-conditioning apparatus by use of the clip. The body has the mounting hole. In a state in which the clip is removed, the communication-adapter mounting device can be mounted by use of the mounting hole to the wall of the indoor space where the air-conditioning apparatus is installed. Consequently, by mounting the clip to the body, the communication-adapter mounting device can be mounted to a suitable location on the housing of the air-conditioning apparatus, and by removing the clip, the communication-adapter mounting device can be mounted to a suitable location in the indoor space where the air-conditioning apparatus is installed. That is, according to an embodiment of the present invention, the location to install the communication-adapter mounting device can be selected depending on the installation condition of the air-conditioning apparatus. This configuration makes it possible to increase the freedom of installation of the communication adapter.

DESCRIPTION OF EMBODIMENTS

A communication-adapter mounting device according to Embodiment of the present invention will be described below with reference to the drawings. The present invention is not limited to Embodiment described below. In the drawings below, the sizes of various components of the communication-adapter mounting device may not be drawn to scale.

Embodiment

Figure 1:
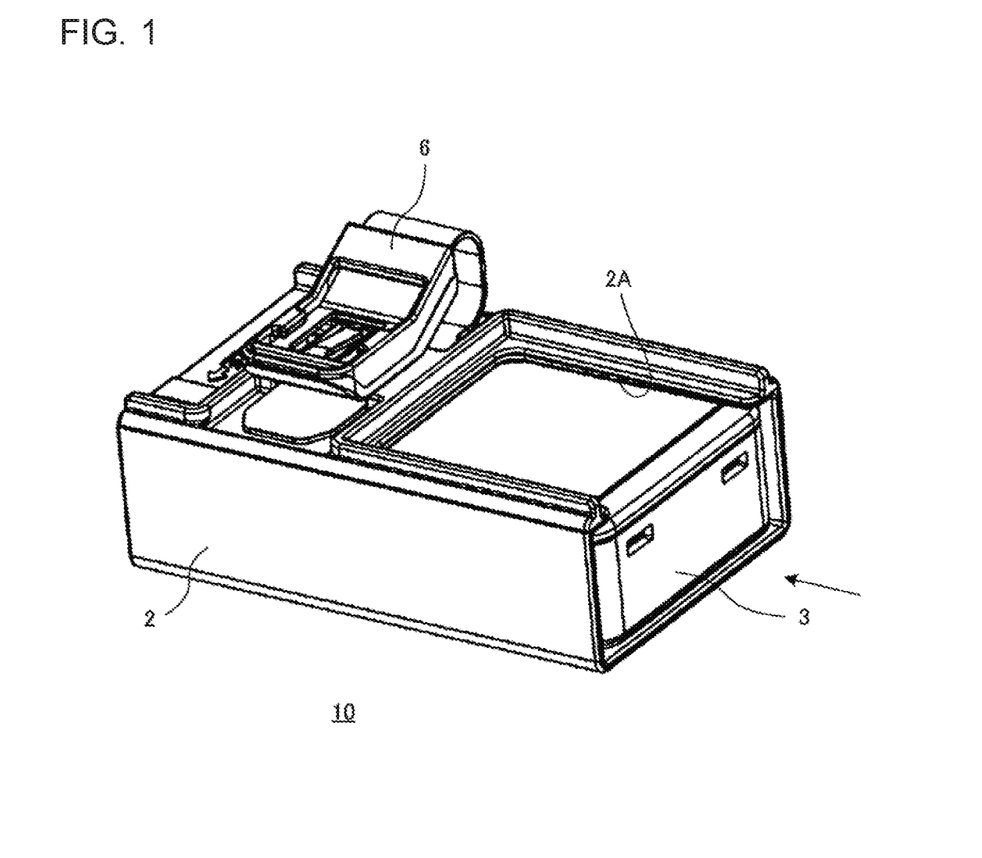
FIG. 1 is a perspective view of a communication-adapter mounting device according to Embodiment of the present invention.

FIG. 1 is a perspective view of the communication-adapter mounting device according to Embodiment of the present invention. A communication-adapter mounting device 10 includes a holder 2 in which a communication adapter 3 is accommodated, and a clip 6. The holder 2 corresponds to the body of the communication-adapter mounting device according to the present invention. The communication adapter 3 is an adapter that relays communication between an air-conditioning apparatus described later and another apparatus. The communication adapter 3 is accommodated in the holder 2 and is allowed to be removed from the holder 2. The clip 6 is a component used for mounting the holder 2 to the housing of the air-conditioning apparatus. The clip 6 is mounted to the holder 2 and is allowed to be removed from the holder 2. FIG. 1 depicts the communication adapter 3 accommodated in the holder 2, with the clip 6 mounted on the holder 2.

Figure 2:
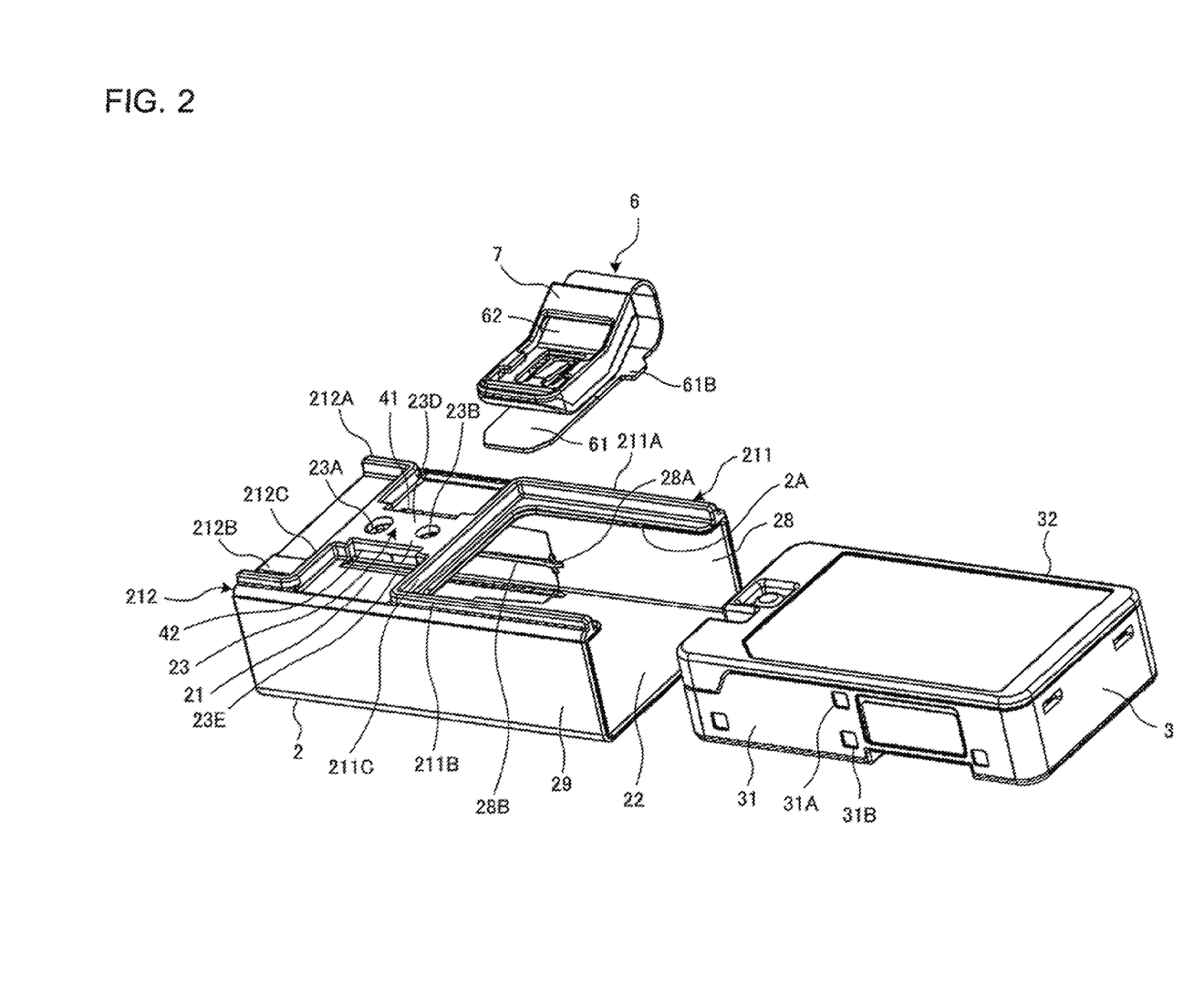
FIG. 2 is a perspective view of the communication-adapter mounting device according to Embodiment of the present invention, illustrating a communication adapter together with the communication-adapter mounting device.
Figure 3:
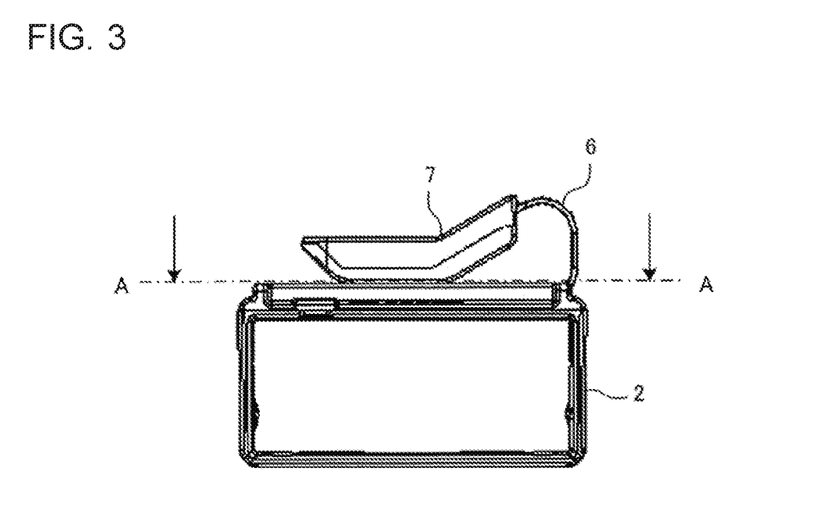
FIG. 3 is a side view of the communication-adapter mounting device according to Embodiment of the present invention.
Figure 4:
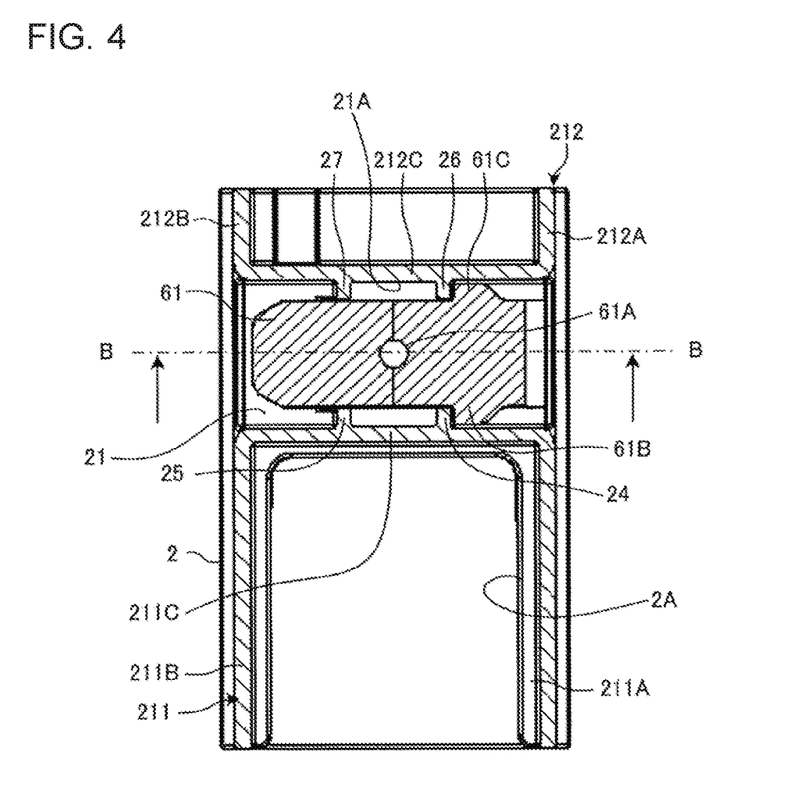
FIG. 4 is a cross-sectional view taken along the line A-A represented by arrows in FIG. 3.

FIG. 2 is a perspective view of the communication-adapter mounting device according to Embodiment of the present invention, illustrating the communication adapter together with the communication-adapter mounting device. In FIG. 2, the clip 6 is removed from the holder 2. FIG. 3 is a side view of the communication-adapter mounting device according to Embodiment of the present invention. FIG. 3 illustrates the communication-adapter mounting device 10 as viewed in the direction of the arrow in FIG. 1. In FIG. 3, the clip 6 is mounted on the holder 2, and the communication adapter 3 is removed from the holder 2. FIG. 4 is a cross-sectional view taken along the line A-A represented by arrows in FIG. 3. The holder 2 is shaped like a box as a whole and has a first face 21, a second face 22, a third face 28, and a fourth face 29. The first face 21 and the second face 22 face each other, and the third face 28 and the fourth face 29 face each other. The holder 2 is open at opposite longitudinal end portions of the holder 2. The communication adapter 3 is allowed to be inserted through whichever one of the openings at opposite longitudinal end portions of the holder 2. The first face 21 of the holder 2 has a rectangular cutout 2A. As illustrated in FIG. 1, a portion of a face of the communication adapter 3 accommodated in the holder 2 is exposed through the cutout 2A.

The first face 21 includes a first projection 211 having a linear shape, and a second projection 212 having a linear shape. The first projection 211 has a pair of edge portions 211A and 211B, and a connecting portion 211C. The edge portions 211A and 211B each extend along the edge extending in the longitudinal direction of the first face 21, and each extend along the peripheral edge of the cutout 2A. The connecting portion 211C connects the edge portion 211A with the edge portion 211B. The edge portion 211A and the edge portion 211B have the same length. Consequently, the connecting portion 211C extends orthogonal to the edge extending in the longitudinal direction of the first face 21, in other words, in parallel with the edge extending in the lateral direction of the first face 21. The second projection 212 is located in an end portion of the first face 21 where the cutout 2A is not provided. The second projection 212 has a pair of edge portions 212A and 212B, and a connecting portion 212C. The edge portions 212A and 212B each extend along the edge extending in the longitudinal direction of the first face 21. The connecting portion 212C connects the edge portion 212A with the edge portion 212B. The edge portion 212A and the edge portion 212B have the same length. Consequently, the connecting portion 212C extends orthogonal to the edge extending in the longitudinal direction of the first face 21, in other words, in parallel with the edge extending in the lateral direction of the first face 21. That is, the connecting portion 211C of the first projection 211 and the connecting portion 212C of the second projection 212 extend in parallel with each other.

As illustrated in FIG. 2, the holder 2 includes an adapter-retaining protrusion 28A, which is provided on the inner peripheral surface of the third face 28 that intersects the first and second faces 21 and 22. The communication adapter 3 includes a retaining recess 31A and a retaining recess 31B, which are provided on a face 31 of the communication adapter 3 that comes into contact with the third face 28 or the fourth face 29 of the holder 2 when the communication adapter 3 is accommodated into the holder 2. The adapter-retaining protrusion on the holder 2, and the retaining recesses on the communication adapter 3 will be described later.

Figure 5:
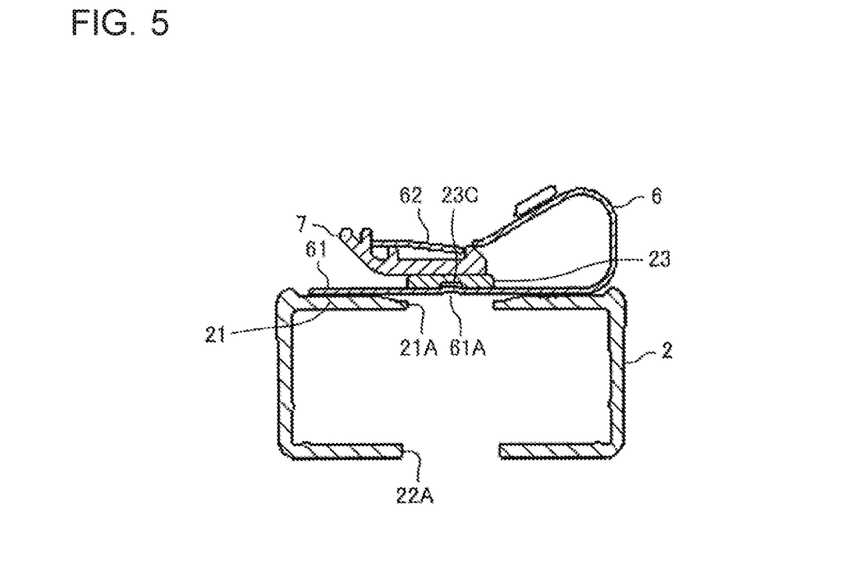
FIG. 5 illustrates a cross-section, taken along the line B-B in FIG. 4, of an end face of the communication-adapter mounting device according to Embodiment of the present invention.
Figure 6:
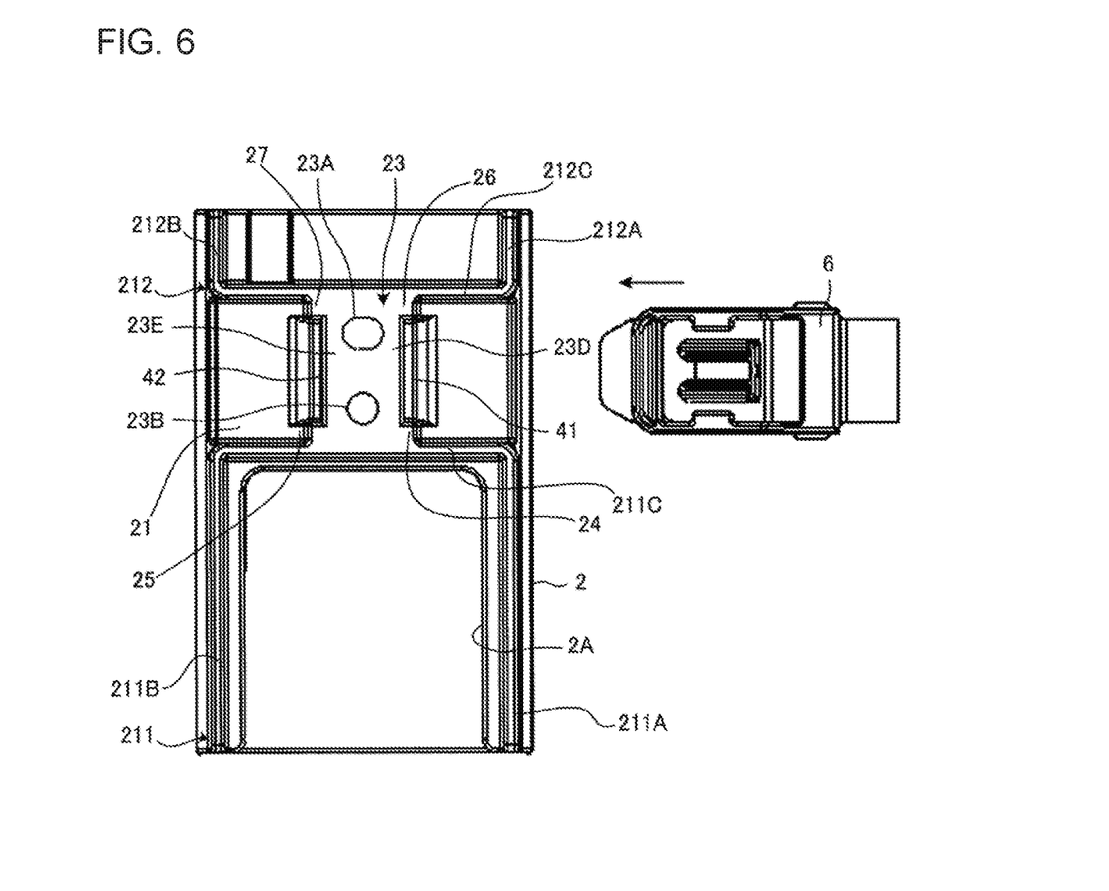
FIG. 6 is a plan view of the communication-adapter mounting device according to Embodiment of the present invention.
Figure 7:
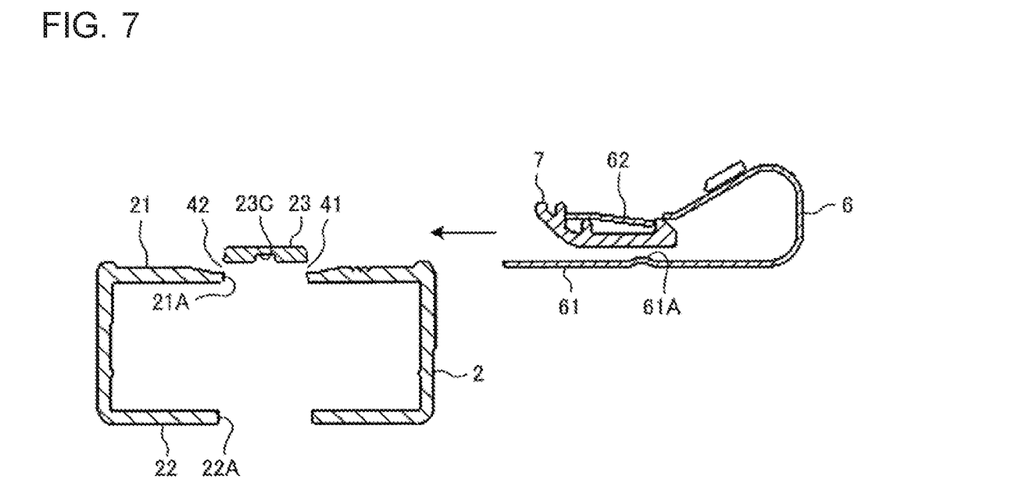
FIG. 7 illustrates an end face of the communication-adapter mounting device according to Embodiment of the present invention.

FIG. 5 illustrates a cross-section, taken along the line B-B in FIG. 4, of an end face of the communication-adapter mounting device according to Embodiment of the present invention. FIG. 6 is a plan view of the communication-adapter mounting device according to Embodiment of the present invention. FIG. 7 illustrates an end face of the communication-adapter mounting device according to Embodiment of the present invention. In FIGS. 6 and 7, the communication adapter 3 and the clip 6 are removed from the holder 2. FIG. 7 illustrates a cross-section of an end face of the holder 2 taken at the same position as the line B-B in FIG. 4. As illustrated in FIGS. 4, 5, and 7, the first face 21 of the holder 2 has a first opening 21A. A mounting plate 23 is located at a position that faces the first opening 21A. The mounting plate 23 corresponds to a plate-like part according to the present invention. The mounting plate 23 is a thin plate-like part having a rectangular shape. Of a pair of edge portions of the mounting plate 23 extending parallel to the edge extending in the lateral direction of the first face 21, one end portion is provided integrally with the connecting portion 211C of the first projection 211, and the other end portion is provided integrally with the connecting portion 212C of the second projection 212. The mounting plate 23 is disposed in such a manner that the surface of the mounting plate 23 that is opposite to the first face is flush with the top surface of the first projection 211 and the top surface of the second projection 212.

Further, the mounting plate 23 has a thickness in a direction orthogonal to the first face 21 that is less than the thickness of each of the first and second projections 211 and 212 in the direction orthogonal to the first face 21. That is, the mounting plate 23 is positioned to face the first opening 21A with a predetermined spacing from the first face 21. The predetermined spacing equals the difference between the thickness of the mounting plate 23 in the direction orthogonal to the first face 21, and the thickness of each of the first and second projections 211 and 212 in the direction orthogonal to the first face 21.

As a result of the above-mentioned configuration, a first slot 41 is defined by an edge portion of the mounting plate 23 that extends in parallel with the edge extending in the longitudinal direction of the first face 21, a portion of the first face 21, and the first opening 21A. Further, a second slot 42 is defined by another edge portion of the mounting plate 23 that extends in parallel with the edge extending in the longitudinal direction of the first face 21, another portion of the first face 21, and the first opening 21A.

As illustrated in FIG. 6, a step portion 24 is provided at the location where an edge portion 23D, which is an edge portion of the mounting plate 23 extending parallel to the edge extending in the longitudinal direction of the first face 21, intersects the connecting portion 211C of the first projection 211. A step portion 26 is provided at the location where the edge portion 23D of the mounting plate 23 intersects the connecting portion 212C of the second projection 212. A step portion 25 is provided at the location where an edge portion 23E, which is an edge portion of the mounting plate 23 extending parallel to the edge extending in the longitudinal direction of the first face 21, intersects the connecting portion 211C of the first projection 211. A step portion 27 is provided at the location where the edge portion 23E of the mounting plate 23 intersects the connecting portion 212C of the second projection 212.

The mounting plate 23 has a mounting hole 23A and a mounting hole 23B. As illustrated in FIGS. 5 and 7, the second face 22 of the holder 2, which faces the first face 21, has a second opening 22A. The mounting hole 23A, the mounting hole 23B, and the second opening 22A will be described later.

As illustrated in FIGS. 2, 5, and 7, the clip 6 has a plate spring structure shaped like a bent strip of thin plate and including a first pinching portion 61 and a second pinching portion 62. A clip cap 7 is attached to the second pinching portion 62. The surface of the first pinching portion 61 that faces the second pinching portion 62 includes a protrusion 61A. The surface of the mounting plate 23 of the holder 2 that faces the first opening 21A includes a recess 23C into which the protrusion 61A is fitted. As illustrated in FIG. 4, the pair of edge portions of the first pinching portion 61 extending in the longitudinal direction of the first pinching portion 61 each have a corresponding one of an engaging portion 61B and an engaging portion 61C. The protrusion 61A corresponds to a clip-retaining portion according to the present invention, and the recess 23C corresponds to a first retaining portion according to the present invention. The engaging portion 61B and the engaging portion 61C each correspond to an engaging portion according to the present invention.

A procedure for mounting the clip 6 to the holder 2 will be described below. As illustrated in FIGS. 6 and 7, the first pinching portion 61 of the clip 6 is inserted through the first slot 41. The clip 6 is pushed in all the way in the direction from the first slot 41 toward the second slot 42 (to be referred to as insertion direction hereinafter), until the distal end portion of the first pinching portion 61 moves past the space between the first opening 21A of the first face 21 and the mounting plate 23 and then passes through the second slot 42. The clip 6 is further pushed in all the way in the insertion direction, until the protrusion 61A of the first pinching portion 61 is fitted into the recess 23C of the mounting plate 23 and the clip 6 is thus retained on the mounting plate 23. The clip 6 is mounted to the holder 2 through the above-mentioned procedure. As illustrated in FIG. 5, the clip 6 is held in such a state in which the first pinching portion 61 is positioned between the mounting plate 23 and the first opening 21A, the surface of the first pinching portion 61 that faces the second pinching portion 62 is placed in contact with the mounting plate 23, and the surface of the first pinching portion 61 that is opposite to the second pinching portion 62 is placed in contact with the first face 21. As described above, in Embodiment, the mounting plate 23 and the first face 21 constitute a clip holding mechanism for holding the clip 6.

Next, a procedure for removing the clip 6 from the holder 2 will be described below. In the state illustrated in FIG. 5, an external force is applied to the clip 6 in a direction from the second slot 42 toward the first slot 41 (to be referred to as removal direction hereinafter), against the retaining force exerted by the protrusion 61A of the first pinching portion 61 and the recess 23C of the mounting plate 23. Then, once the protrusion 61A is disengaged from the recess 23C, the clip 6 is moved further in the removal direction, and the first pinching portion 61 is pulled out from the first slot 41. The clip 6 is thus removed from the holder 2.

Although the first pinching portion 61 is inserted from the first slot 41 and also pulled out from the first slot 41 in the above-mentioned procedure, the procedure is not limited to the one mentioned above. Alternatively, the clip 6 may be mounted to the holder 2 by inserting the first pinching portion 61 from the second slot 42, and the clip 6 may be removed from the holder 2 by pulling out the first pinching portion 61 from the second slot 42. In this case, the insertion direction is the direction from the second slot 42 toward the first slot 41, and the removal direction is the direction from the first slot 41 toward the second slot 42.

The engaging portion 61B and the engaging portion 61C are positioned in such a manner that, when the protrusion 61A of the first pinching portion 61 is fitted in the recess 23C of the mounting plate 23 by inserting the first pinching portion 61 of the clip 6 from the first slot 41, the engaging portion 61B of the first pinching portion 61 is engaged with the step portion 24 and the engaging portion 61C is engaged with the step portion 26 as illustrated in FIG. 4. Further, the engaging portion 61B and the engaging portion 61C are positioned in such a manner that, when the protrusion 61A of the first pinching portion 61 is fitted in the recess 23C of the mounting plate 23 by inserting the first pinching portion 61 from the second slot 42, the engaging portion 61B of the first pinching portion 61 is engaged with the step portion 27, and the engaging portion 61C is engaged with the step portion 25.

The adapter-retaining protrusions on the holder 2 and the retaining recesses on the communication adapter 3 will be described below in detail. As illustrated in FIG. 2, the holder 2 includes the adapter-retaining protrusion 28A provided on the inner peripheral surface of the third face 28 that intersects the first and second faces 21 and 22. The adapter-retaining protrusion 28A has the shape of a cross. The adapter-retaining protrusion 28A is positioned closer to the second face 22 than is the center of the third face 28 in the lateral direction. The adapter-retaining protrusion 28A includes an adapter guide protrusion 28B having a linear shape and provided integrally with the adapter-retaining protrusion 28A. The adapter guide protrusion 28B extends toward an end portion of the holder 2 that is opposite to the end portion where the cutout 2A is provided. The inner peripheral surface of the fourth face 29 that faces the third face 28 also includes an adapter-retaining protrusion (not illustrated) similar to the adapter-retaining protrusion 28A, and an adapter guide protrusion (not illustrated) similar to the adapter guide protrusion 28B.

The communication adapter 3 includes the retaining recess 31A and the retaining recess 31B, which are provided on the face 31 of the communication adapter 3 that comes into contact with the third face 28 or the fourth face 29 of the holder 2 when the communication adapter 3 is accommodated into the holder 2. The retaining recesses 31A and 31B have such a shape that allows their engagement with the adapter-retaining protrusion 28A and with the adapter-retaining protrusion provided on the fourth face 29. The retaining recess 31A is provided at a position closer to one of a pair of faces intersecting the face 31 than is the center of the face 31, and the retaining recess 31B is provided at a position closer to the other of the pair of faces intersecting the face 31 than is the center of the face 31. Two retaining recesses similar to the retaining recesses 31A and 31B are also provided on a face 32 of the communication adapter 3 that comes into contact with the third face 28 or the fourth face 29 of the holder 2 when the communication adapter 3 is accommodated into the holder 2.

Figure 8:
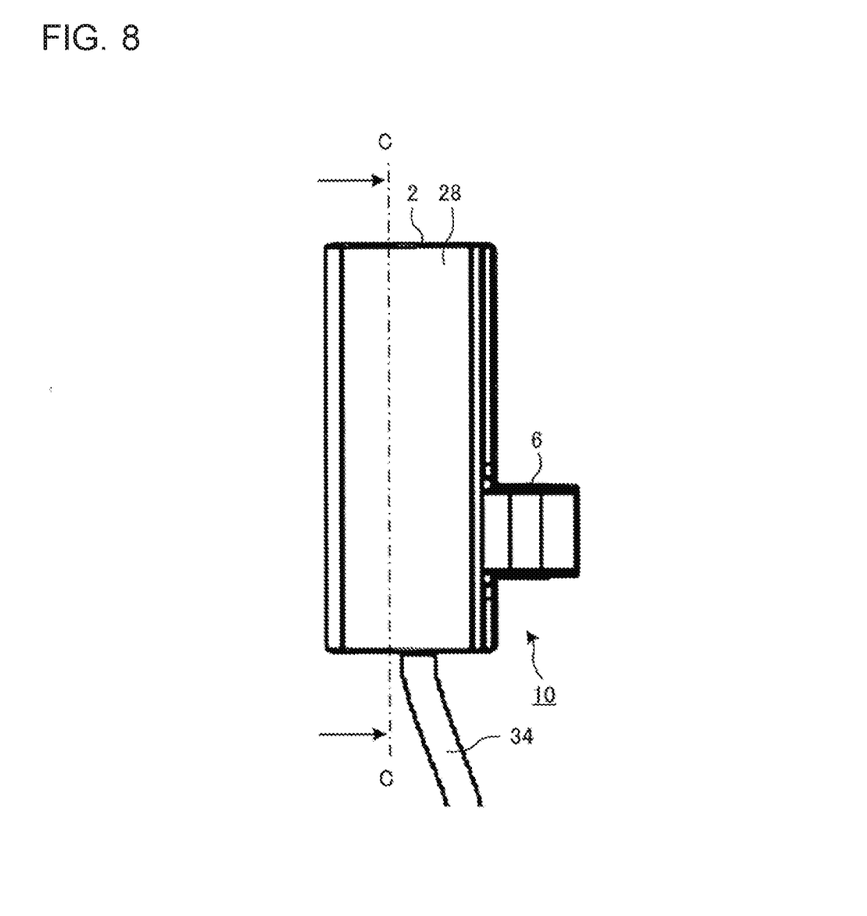
FIG. 8 is a side view of a holder in which a communication adapter is accommodated.
Figure 9:
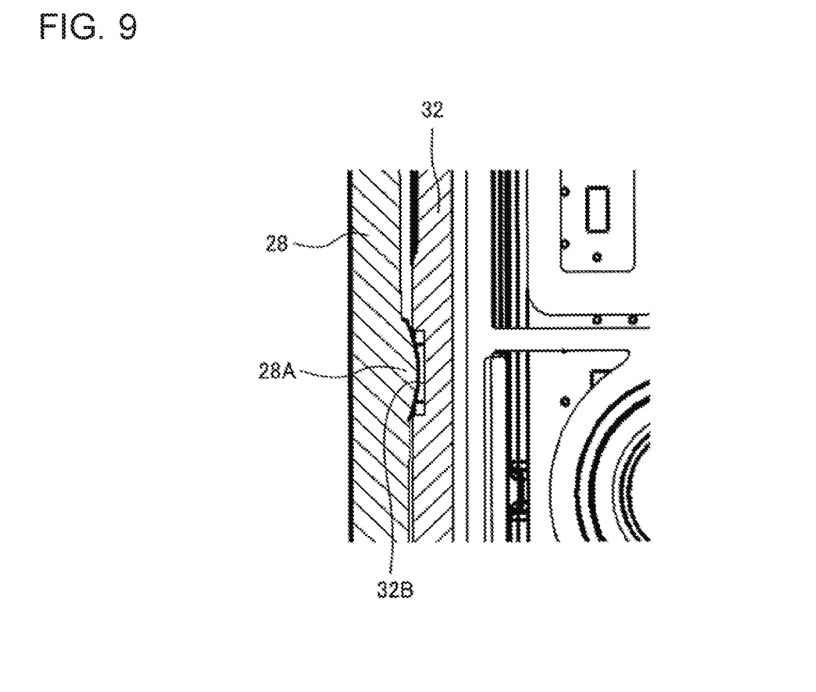
FIG. 9 is a partially enlarged cross-sectional view taken along the line C-C represented by arrows in FIG. 8.

FIG. 8 is a side view of the holder in which the communication adapter is accommodated. FIG. 8 depicts the holder 2 as viewed from the direction of the third face 28. FIG. 9 is a partially enlarged cross-sectional view taken along the line C-C represented by arrows in FIG. 8. As illustrated in FIG. 9, in a state in which the communication adapter 3 is accommodated in the holder 2, the adapter-retaining protrusion 28A provided on the third face 28 of the holder 2 is fitted in a retaining recess 32B provided on the face 32 of the communication adapter 3. In this state, the adapter-retaining protrusion provided on the fourth face 29 of the holder 2 also is fitted in the retaining recess 31B provided on the face 31 of the communication adapter 3. The adapter-retaining protrusion 28A, and the adapter-retaining protrusion provided on the fourth face 29 each correspond to a second retaining portion according to the present invention. The retaining recess 31A, the retaining recess 31B, and the retaining recesses provided on the face 32 each correspond to an adapter-retaining portion according to the present invention.

The adapter guide protrusion 28B, and the adapter guide protrusion provided on the fourth face 29 aid in smooth movement of the communication adapter 3 inside the holder 2 as the communication adapter 3 is inserted into or removed from the holder 2.

Figure 10:
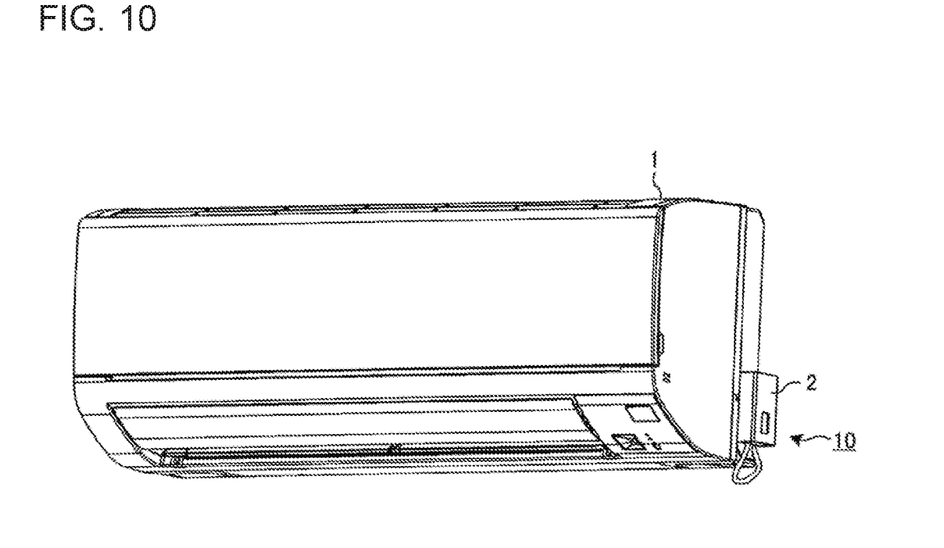
FIG. 10 is a perspective view of a state in which the communication-adapter mounting device according to Embodiment of the present invention is mounted on the lateral surface of an air-conditioning apparatus.
Figure 11:
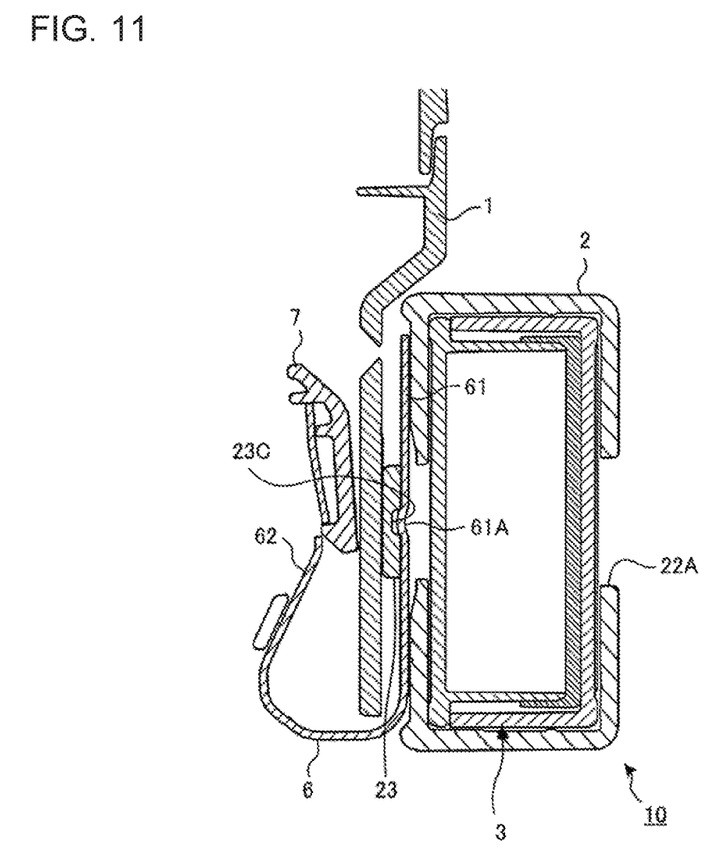
FIG. 11 is an enlarged cross-sectional view of the mounting portion of the communication-adapter mounting device.

FIG. 10 is a perspective view of a state in which the communication-adapter mounting device according to Embodiment of the present invention is mounted on the lateral surface of an air-conditioning apparatus. FIG. 11 is an enlarged cross-sectional view of an end face of the mounting portion of the communication-adapter mounting device. As illustrated in FIG. 10, the communication-adapter mounting device 10 is mounted on the lateral surface of an air-conditioning apparatus 1. As illustrated in FIG. 11, a portion of the lateral surface of the housing of the air-conditioning apparatus 1 is pinched between the mounting plate 23 of the holder 2 and the second pinching portion 62 of the clip 6. In this state, the communication-adapter mounting device 10 with the communication adapter 3 accommodated in the holder 2 is secured to the air-conditioning apparatus 1 by the spring force of the clip 6. The communication adapter 3 can be thus mounted to the lateral surface of the air-conditioning apparatus 1.

Figure 12:
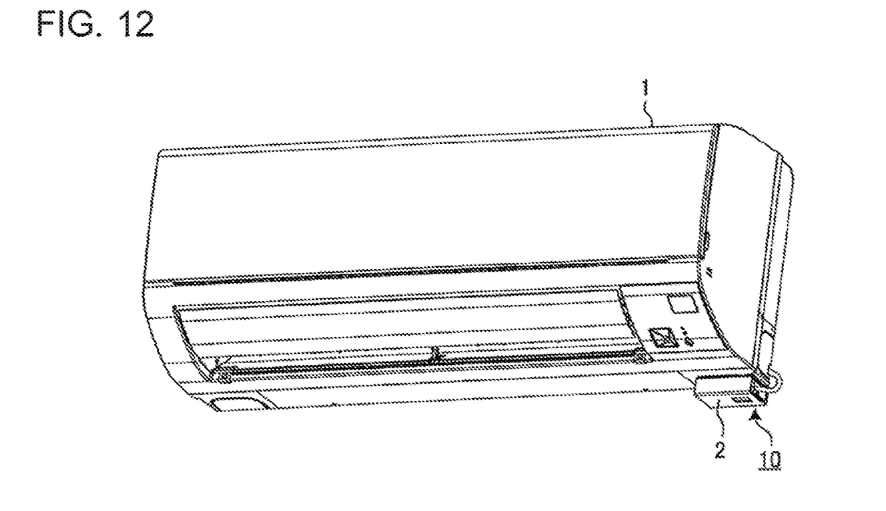
FIG. 12 is a perspective view of a state in which the communication-adapter mounting device according to Embodiment of the present invention is mounted on the bottom surface of the air-conditioning apparatus.

FIG. 12 is a perspective view of a state in which the communication-adapter mounting device according to Embodiment of the present invention is mounted on the bottom surface of the air-conditioning apparatus. As with the example illustrated in FIG. 11, the communication-adapter mounting device 10 is secured to the air-conditioning apparatus 1 by mounting the communication-adapter mounting device 10 in such a manner that a portion of the bottom surface of the housing of the air-conditioning apparatus 1 is pinched between the mounting plate 23 of the holder 2 and the second pinching portion 62 of the clip 6. The communication adapter 3 can be thus mounted to the bottom surface of the air-conditioning apparatus 1.

Figure 13:
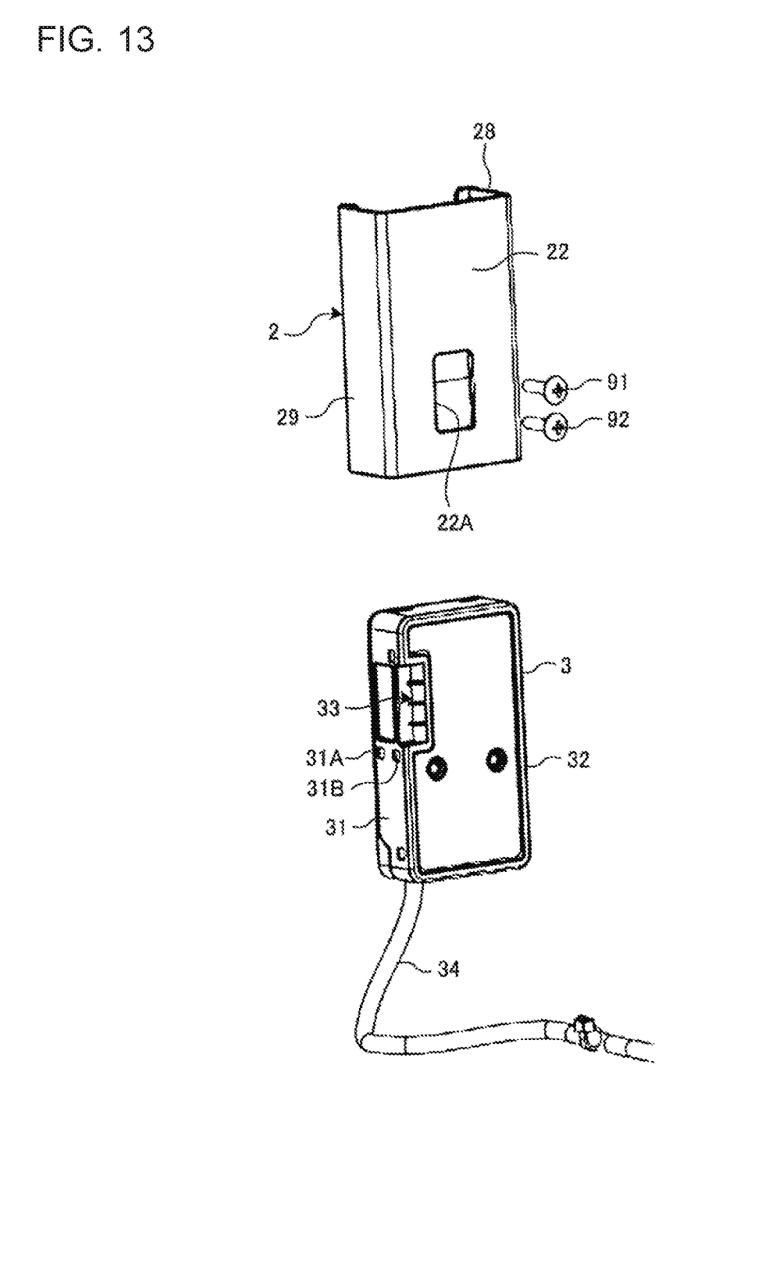
FIG. 13 is an exploded perspective view of the communication-adapter mounting device according to Embodiment of the present invention, illustrating how the holder of the communication-adapter mounting device is secured in place with screws.
Figure 14:
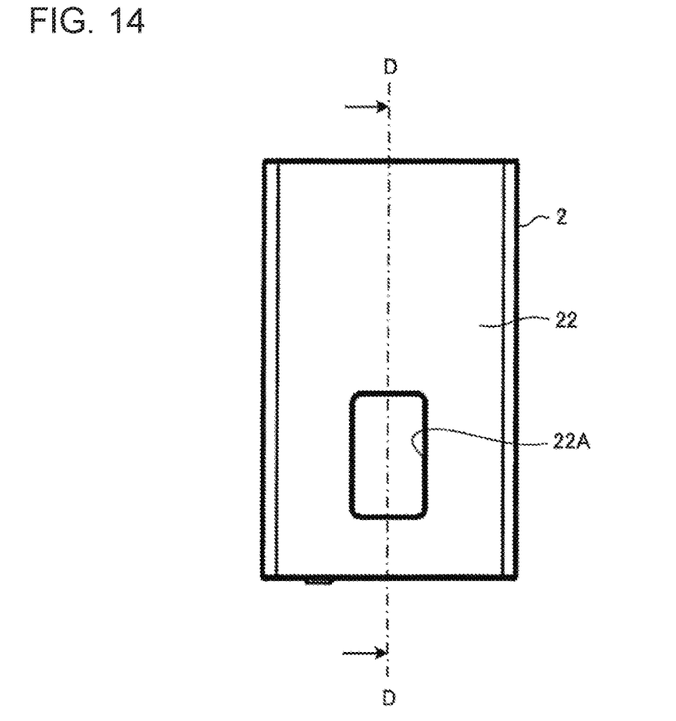
FIG. 14 is a side view of the holder of the communication-adapter mounting device according to Embodiment of the present invention.

FIG. 13 is an exploded perspective view of the communication-adapter mounting device according to Embodiment of the present invention, illustrating how the holder of the communication-adapter mounting device is secured in place with screws. FIG. 14 is a side view of the holder of the communication-adapter mounting device according to Embodiment of the present invention. The second opening 22A is provided at a position on the second face 22 that faces the mounting plate 23. The communication adapter 3 to be accommodated into the holder 2 includes an indicator lamp 33 that indicates the on-off state of the power supply and communication status, and a communication cable 34 connected to the control board (not illustrated) of the air-conditioning apparatus 1.

Figure 15:
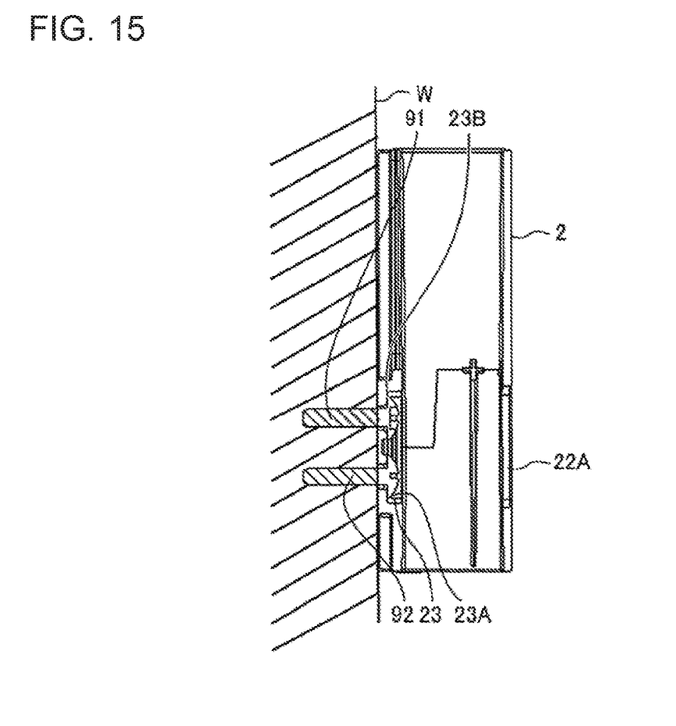
FIG. 15 is a cross-sectional view of the holder of the communication-adapter mounting device according to Embodiment of the present invention.

FIG. 15 is a cross-sectional view of the holder of the communication-adapter mounting device according to Embodiment of the present invention. FIG. 15 illustrates a cross-section, taken along the line D-D in FIG. 14, of the holder 2 secured on an indoor wall Won which to install the air-conditioning apparatus. With reference to FIGS. 13 to 15, the following describes how the holder 2 is secured to the indoor wall W on which to install the air-conditioning apparatus. The holder 2 without the communication adapter 3 accommodated in the holder 2 is positioned at the installation location on the wall W in a state in which the mounting plate 23 is placed in contact with the wall W and the second opening 22A faces indoors. Then, a screw 91 and a screw 92 are inserted into the holder 2 through the second opening 22A. Subsequently, the screw 91 is inserted into the mounting hole 23B of the mounting plate 23 and screwed into the wall W, and the screw 92 is inserted into the mounting hole 23A of the mounting plate 23 and screwed into the wall W. The holder 2 is thus secured to the wall W. Once the holder 2 is secured to the wall W, the communication adapter 3 is inserted from, for example, below the holder 2. Then, the retaining recess 31B provided on the face 31 of the communication adapter 3 is fit onto the adapter-retaining protrusion provided on the fourth face 29 of the holder 2 and the above-mentioned retaining recess provided on the face 32 of the communication adapter 3 is fitted onto the adapter-retaining protrusion 28A provided on the third face 28 of the holder 2. The communication adapter 3 can be thus mounted onto the wall W.

As described above, the communication-adapter mounting device 10 according to Embodiment includes the holder 2 and the clip 6, and the holder 2 is provided with the mounting plate 23. The clip 6 is held by the clip holding mechanism that includes the first face 21 and the mounting plate 23 of the holder 2 and is allowed to be removed from the clip holding mechanism. Then, with the clip 6 mounted on the holder 2, the communication-adapter mounting device 10 can be mounted to a desired location on the housing of the air-conditioning apparatus 1 by use of the clip 6. The mounting plate 23 has the mounting hole 23A and the mounting hole 23B. With the clip 6 removed from the holder 2, the screw 91 and the screw 92 are respectively inserted into the mounting hole 23B and the mounting hole 23A and screwed into the wall W. The communication-adapter mounting device 10 can be thus mounted onto the wall W. Consequently, by mounting the clip 6, the communication-adapter mounting device 10 can be mounted to a suitable location on the housing of the air-conditioning apparatus 1, and by removing the clip 6, the communication-adapter mounting device 10 can be mounted to a suitable location in the indoor space where the air-conditioning apparatus 1 is installed. That is, according to Embodiment, the location to install the communication-adapter mounting device 10 can be selected depending on the installation condition of the air-conditioning apparatus 1. This configuration makes it possible to increase the freedom of installation of the communication adapter 3.

The clip 6 according to Embodiment has a plate spring structure including the first pinching portion 61 and the second pinching portion 62. The mounting plate 23 is provided to the first face 21 of the holder 2 in such a manner that the mounting plate 23 faces the first opening 21A provided in the first face 21. The clip holding mechanism is configured to hold the clip 6 in a state in which the first pinching portion 61 is positioned between the mounting plate 23 and the first opening 21A, the surface of the first pinching portion 61 that faces the second pinching portion 62 is placed in contact with the mounting plate 23, and the surface of the first pinching portion 61 that is opposite to the second pinching portion 62 is placed in contact with the first face 21. This configuration helps ensure that the clip 6 mounted on the holder 2 does not rattle in a direction intersecting the mounting plate 23.

According to Embodiment, the edge portion 23D, which is one of the pair of edge portions 23D and 23E of the mounting plate 23 extending parallel to the edge extending in the longitudinal direction of the first face 21, a portion of the first face 21, and the first opening 21A define one of the pair of slots, that is, the first slot 41, and the edge portion 23E, which is the other of the pair of edge portions 23D and 23E of the mounting plate 23 extending parallel to the edge extending in the longitudinal direction of the first face 21, another portion of the first face 21, and the first opening 21A define the other of the pair of slots, that is, the second slot 42. The first pinching portion 61 of the clip 6 is allowed to be inserted and removed through both of the first slot 41 and the second slot 42. Consequently, by changing the direction of insertion of the clip 6, the mounting orientation of the clip 6 to the holder 2 can be changed. As a result, even when the communication-adapter mounting device 10 can be mounted only at a certain location on the housing of the air-conditioning apparatus 1 due to the installation condition of the air-conditioning apparatus 1, the communication-adapter mounting device 10 can be mounted at a suitable location by changing the mounting orientation of the clip 6 as appropriate. That is, the above-mentioned configuration increases the freedom of installation of the communication adapter 3.

The mounting holes 23A and 23B for securing the holder 2 to the wall W are provided in the mounting plate 23 on which to mount the clip 6. The mounting holes 23A and 23B become exposed when the clip 6 is removed from the holder 2. That is, other than the component for mounting the holder 2 to the housing of the air-conditioning apparatus 1, no additional component is required to mount the holder 2 to the wall W. This configuration helps reduce an increase in the number of components in increasing the freedom of installation of the communication adapter 3.

In Embodiment, the protrusion 61A is provided on the surface of the first pinching portion 61 of the clip 6, and the mounting plate 23 includes the recess 23C into which the protrusion 61A is fitted. This configuration facilitates positioning at the time of mounting the clip 6 to the mounting plate 23. This configuration also helps reduce rattling in the direction of the plane of the mounting plate 23, which may occur after the clip 6 is mounted to the holder 2.

According to Embodiment, the edges of the first pinching portion 61 of the clip 6 are each provided with a corresponding one of the engaging portions 61B and 61C. In a state in which the protrusion 61A is fitted in the recess 23C of the mounting plate 23, that is, in a state in which the clip 6 is held by the above-mentioned clip holding mechanism, the engaging portion 61B is engaged with the step portion 24 or the step portion 27, and the engaging portion 61C is engaged with the step portion 25 or the step portion 26. This configuration prevents the protrusion 61A from being disengaged from the recess 23C when an external force is further applied in the insertion direction to the clip 6 held by the clip holding mechanism.

According to Embodiment, the holder 2 has the second opening 22A provided in the second face 22 that faces the first face 21. The screws 91 and 92, which are respectively secured into the wall W through the mounting holes 23B and 23A for securing the communication-adapter mounting device 10 to the wall W, are allowed to be inserted into the holder 2 from an outside of the holder 2 through the second opening 22A. This configuration facilitates easy mounting of the screws 91 and 92.

The third face 28 of the holder 2 includes the adapter-retaining protrusion 28A, and the fourth face of the holder 2 includes a similar adapter-retaining protrusion. These adapter-retaining protrusions are each fitted in a corresponding one of a set of the retaining recesses 31A and 31B provided on the face 31 of the communication adapter 3 and a set of similar retaining recesses provided on the face 32 of the communication adapter 3. This configuration thus prevents dropping of the communication adapter 3 from the holder 2.

The above-mentioned drop prevention mechanism for the communication adapter 3 includes a projecting element provided on the holder 2 and a recessed element provided on the communication adapter 3. Consequently, the drop prevention mechanism can be provided without increasing the outer dimensions of the communication adapter 3.

In accommodating the communication adapter 3 into the holder 2, the communication adapter 3 is accommodated in such a manner that the indicator lamp 33 comes into contact with the first face 21 or the second face 22 of the holder 2. This configuration allows lighting and flashing of the indicator lamp 33 to be shaded. This configuration thus prevents lighting and flashing of the indicator lamp 33 from becoming visually annoying to the user.

Although the mounting plate 23 includes the recess 23C, and the first pinching portion 61 of the clip 6 includes the protrusion 61A, the configuration is not limited to the one described above. The relationship between these projecting and recessed elements may be reversed in mounting the first pinching portion 61 to the mounting plate 23.

As described above, the third face 28 of the holder 2 includes the adapter-retaining protrusion 28A, the fourth face of the holder 2 includes a similar adapter-retaining protrusion, the face 31 of the communication adapter 3 includes the retaining recesses 31A and 31B, and the face 32 of the communication adapter 3 includes similar retaining recesses. However, the configuration is not limited to the one described above. The relationship between these projecting and recessed elements may be reversed in preventing dropping of the communication adapter 3 from the holder 2.

REFERENCE SIGNS LIST air-conditioning apparatus 2 holder 2A cutout 3 communication adapter 6 clip 7 clip cap 10 communication-adapter mounting device 21 first face 21A first opening 22 second face 22A second opening 23 mounting plate 23A mounting hole 23B mounting hole 23C recess 23D edge portion 23E edge portion 24 step portion 25 step portion 26 step portion 27 step portion 28 third face 28A adapter-retaining protrusion 28B adapter guide protrusion 29 fourth face 31 face 31A retaining recess 31B retaining recess 32 face 32B retaining recess 33 indicator lamp 34 communication cable 41 first slot 42 second slot 61 first pinching portion 61A protrusion 61B engaging portion 61C engaging portion 62 second pinching portion 91 screw 92 screw 211 first projection 211A edge portion 211B edge portion 211C connecting portion 212 second projection 212A edge portion 212B edge portion 212C connecting portion W wall

The invention claimed is:

1. A communication-adapter mounting device for mounting a communication adapter that relays communication between an air-conditioning apparatus and an other apparatus, the communication-adapter mounting device comprising:

a body into which the communication adapter is to be accommodated and from which the communication adapter is allowed to be removed; and a clip to mount the body to a housing of the air-conditioning apparatus, the body having a mounting hole for securing the communication-adapter mounting device to an installation location in which to install the communication adapter, the body having a clip holding mechanism to hold the clip and to allow the clip to be removed, the clip including a plate spring structure, the plate spring structure being shaped like a bent strip of thin plate and including a pair of pinching portions that correspond to a first pinching portion and a second pinching portion, the clip holding mechanism including a mounting plate that is provided to a first face of the body and that faces a first opening provided in the first face, the clip holding mechanism being configured to hold the clip in a state in which the first pinching portion of the clip is positioned between the mounting plate and the first opening, a surface of the first pinching portion that faces the second pinching portion is placed in contact with the mounting plate, and a surface of the first pinching portion that is opposite to the second pinching portion is placed in contact with the first face.

2. The communication-adapter mounting device of claim 1, wherein the mounting plate has a rectangular shape, wherein one of a pair of edge portions of the mounting plate, a portion of the first face of the body, and the first opening defines one of a pair of slots, wherein an other one of the pair of edge portions of the mounting plate, an other portion of the first face of the body, and the first opening defines an other one of the pair of slots, and wherein the first pinching portion of the clip is allowed to be inserted and removed through both of the pair of slots.

3. The communication-adapter mounting device of claim 2, wherein the clip includes an engaging portion provided in an edge portion of the first pinching portion, and wherein the mounting plate includes a step portion that, in a state in which the first pinching portion is inserted through one of the pair of slots and the clip is held by the clip holding mechanism, is engaged with the engaging portion to prevent the clip from moving further in a direction through which the clip is inserted.

4. The communication-adapter mounting device of claim 1, wherein the mounting hole is provided on the mounting plate, and wherein the mounting hole is exposed in a state in which the clip is removed from the body.

5. The communication-adapter mounting device of claim 1, wherein the clip includes a clip-retaining portion on a surface of the first pinching portion, and wherein the mounting plate includes a first retaining portion into which the clip-retaining portion is to be fitted.

6. The communication-adapter mounting device of claim 1, wherein a second opening is provided in a second face that faces the first face of the body at a position that faces the mounting plate, wherein the second opening allows a securing part to be inserted through the second opening from an outside of the body, and wherein the securing part is to be secured to the installation location through the mounting hole for securing the communication-adapter mounting device to the installation location.

7. The communication-adapter mounting device of claim 1, wherein an inner peripheral surface of the body includes a second retaining portion into which an adapter-retaining portion is to be fitted, and the adapter-retaining portion is provided on an outer peripheral surface of the communication adapter.

* * * * *